United States Patent
Sankin et al.

(10) Patent No.: US 10,026,861 B2
(45) Date of Patent: Jul. 17, 2018

(54) PHOTOVOLTAIC DEVICE AND METHOD OF FORMATION

(71) Applicant: First Solar, Inc., Perrysburg, OH (US)

(72) Inventors: Igor Sankin, Perrysburg, OH (US); Markus Gloeckler, Perrysburg, OH (US); Benyamin Buller, Perrysburg, OH (US); Kieran Tracy, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 267 days.

(21) Appl. No.: 13/653,051

(22) Filed: Oct. 16, 2012

(65) Prior Publication Data

US 2013/0098433 A1    Apr. 25, 2013

Related U.S. Application Data

(60) Provisional application No. 61/547,924, filed on Oct. 17, 2011.

(51) Int. Cl.
| | |
|---|---|
| *H01L 31/065* | (2012.01) |
| *H01L 31/18* | (2006.01) |
| *H01L 31/0296* | (2006.01) |
| *H01L 31/073* | (2012.01) |
| *H01L 21/02* | (2006.01) |

(52) U.S. Cl.
CPC ...... *H01L 31/065* (2013.01); *H01L 31/02966* (2013.01); *H01L 31/073* (2013.01); *H01L 31/18* (2013.01); *H01L 31/1828* (2013.01); *H01L 31/1832* (2013.01); *H01L 21/0248* (2013.01); *H01L 21/0251* (2013.01); *H01L 21/02411* (2013.01); *H01L 21/02422* (2013.01); *H01L 21/02491* (2013.01); *H01L 21/02505* (2013.01); *H01L 21/02562* (2013.01); *Y02E 10/543* (2013.01); *Y02P 70/521* (2015.11)

(58) Field of Classification Search
CPC .................................. H01L 31/02966
USPC ........................................... 136/255
See application file for complete search history.

(56) References Cited

U.S. PATENT DOCUMENTS

| | | | | |
|---|---|---|---|---|
| 4,710,589 | A * | 12/1987 | Meyers et al. | 136/258 |
| 5,391,882 | A * | 2/1995 | Rhiger | 250/370.13 |
| 5,909,632 | A * | 6/1999 | Gessert | H01L 29/45 136/256 |
| 6,803,557 | B1 * | 10/2004 | Taylor et al. | 250/214.1 |
| 7,939,363 | B1 | 5/2011 | Johnson et al. | |
| 2009/0235986 | A1 | 9/2009 | Hotz et al. | |
| 2011/0005594 | A1 * | 1/2011 | Powell et al. | 136/258 |

FOREIGN PATENT DOCUMENTS

| | | |
|---|---|---|
| WO | WO 2008/073469 A1 | 6/2008 |
| WO | WO 2009/120340 A1 | 10/2009 |
| WO | WO 2009/158547 A2 | 12/2009 |

\* cited by examiner

*Primary Examiner* — Jayne L Mershon
(74) *Attorney, Agent, or Firm* — MacMillan, Sobanski & Todd, LLC

(57) ABSTRACT

An improved photovoltaic device and methods of manufacturing the same that includes an interface layer adjacent to a semiconductor absorber layer, where the interface layer includes a material in the semiconductor layer which decreases in concentration from the side of the interface layer contacting the absorber layer to an opposite side of the interface layer.

48 Claims, 8 Drawing Sheets

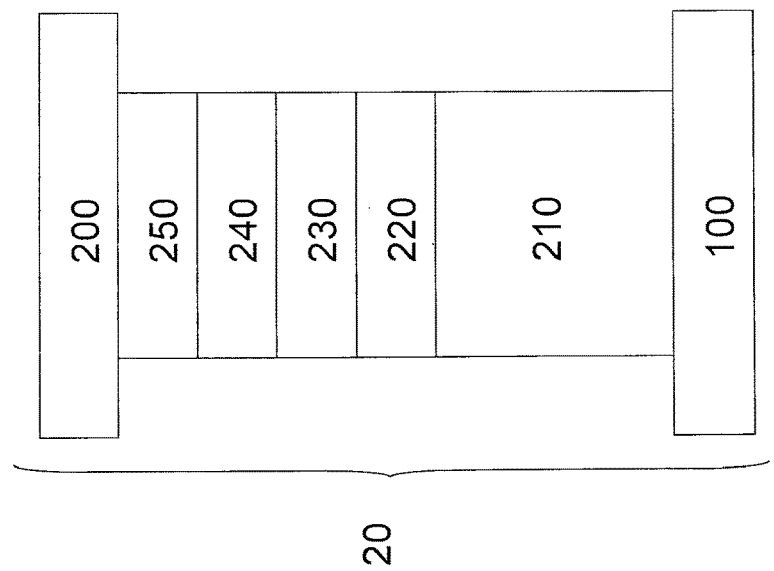

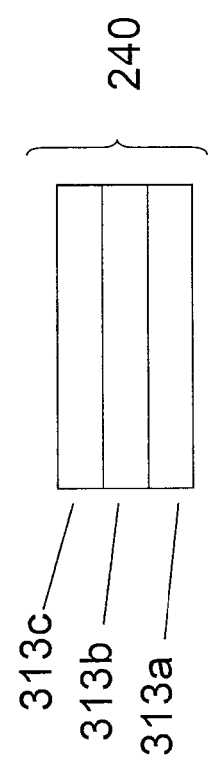

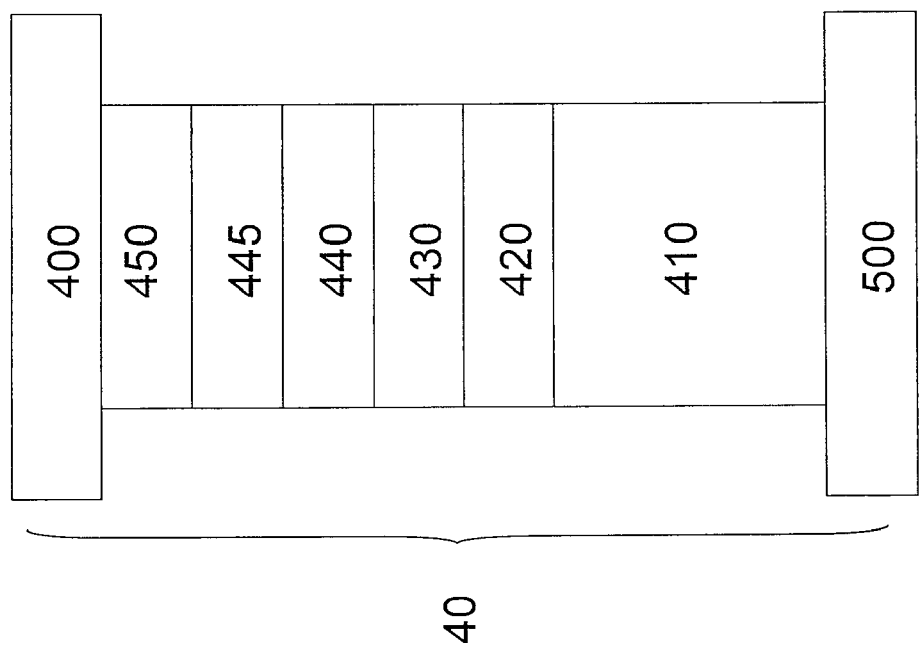

PHOTOVOLTAIC DEVICE AND METHOD OF FORMATION

CLAIM FOR PRIORITY

This application claims priority under 35 U.S.C. § 119(e) to U.S. Provisional Patent Application Ser. No. 61/547,924 filed on Oct. 17, 2011, which is hereby incorporated by reference in its entirety.

TECHNICAL FIELD

The present invention relates to photovoltaic devices and methods of manufacturing the same.

BACKGROUND

Thin film photovoltaic devices can include semiconductor material deposited over a substrate, for example, with a first semiconductor layer serving as a window layer and a second semiconductor layer serving as an absorber layer. The semiconductor window layer, for example, a cadmium sulfide layer, can allow the penetration of solar radiation to the absorber layer, for example, a cadmium telluride layer, for conversion of solar energy to electricity.

During conversion of solar energy to electricity in the photovoltaic device, some minority electron carriers penetrate through the absorber layer to a back contact adjacent to the semiconductor layer where they combine with hole carriers, causing power dissipation inside the device, thereby reducing power conversion efficiency. To eliminate power dissipation, an additional semiconductor layer may be deposited between the semiconductor absorber layer and the back contact layer as a barrier or reflector against minority electron carrier diffusion. The reflector layer is made of a semiconductor material with electron affinity lower than that of the absorber layer, which forces electron carrier flow back toward the electron absorber layer, minimizing recombination at the back contact.

Although the reflector layer should reduce power dissipation and increase power conversion efficiency, lattice mismatch between the reflector layer and the absorber layer can partially negate this benefit. Semiconductor materials contain a lattice, or a periodic arrangement of atoms specific to a given material. Lattice mismatching refers to a situation wherein two materials featuring different lattice constants (a parameter defining the unit cell of a crystal lattice, that is, the length of an edge of the cell or an angle between edges) are brought together by deposition of one material on top of another. In general, lattice mismatch can cause misorientation of film growth, film cracking, and creation of point defects. In typical photovoltaic devices, lattice mismatching can occur, for example, between the semiconductor absorber layer and the semiconductor reflector layer. Lattice mismatch between the semiconductor absorber layer and the semiconductor reflector reduces desired electron reflection. Power dissipation within the photovoltaic device continues, thereby negating the desired benefits of the reflector layer and reducing power conversion efficiency.

An improved photovoltaic device and method for manufacturing the same that mitigates against lattice mismatching between the semiconductor absorber layer and the semiconductor reflector layer is desirable.

DESCRIPTION OF DRAWINGS

FIG. 3 is a schematic of a photovoltaic device having multiple layers;

FIG. 4 is a schematic of a multilayered structure having multiple conductive layers;

FIG. 6 is a schematic of a photovoltaic device having multiple layers;

DETAILED DESCRIPTION

Photovoltaic modules can include a plurality of interconnected photovoltaic cells formed from various material layers which are patterned into the cells.

Figure 1:
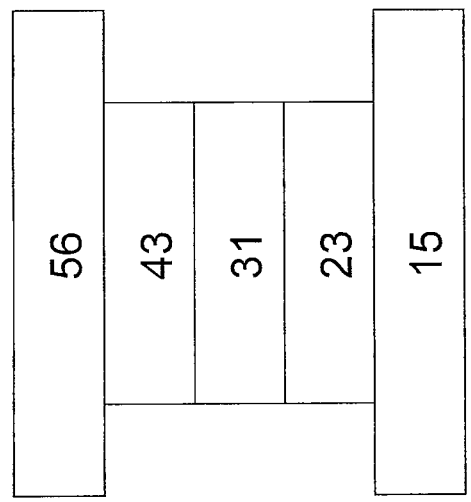
FIG. 1 is a schematic of a photovoltaic device having multiple layers.

Referring to FIG. 1, by way of one example, a photovoltaic device may include a first substrate 15, such as glass, with a front contact 23 formed adjacent thereto. The front contact 23 may include a multilayered stack including a transparent conductive oxide (TCO).

A semiconductor layer 31 may be positioned adjacent to front contact 23. A back contact 43 may be positioned adjacent to semiconductor layer 31, and a back support 56 may be applied adjacent to the back contact 43. Back contact 43 may include any suitable contact material, including, for example metals such as molybdenum, nickel, copper, aluminum, titanium, palladium, tungsten, cobalt, chrome, or oxidized or nitrided compounds of these materials.

It should be noted and appreciated that any of the aforementioned layers may include multiple layers, and that adjacent does not necessarily mean "directly on," such that in some embodiments, one or more additional layers may be positioned between the layers depicted. A "layer" can include any amount of any material that contacts all or a portion of a surface. For example, a barrier layer may optionally be positioned between first substrate 15 and transparent conductive oxide layer 23. The barrier layer can be transparent, thermally stable, with a reduced number of pin holes (i.e., pin-sized holes which may develop as a result of the intrinsically imperfect nature of thin-film deposition) and having high sodium-blocking capability to impede sodium and/or contaminant diffusion from the first substrate 15. A buffer layer may also optionally be positioned between transparent conductive oxide layer 23 and semiconductor layer 31 to decrease the likelihood of irregularities that may occur during the formation of the semiconductor window layer. The substrate 15 and back support 56 may serve as front and back supports for the photovoltaic device, and may both include glass.

Figure 2:
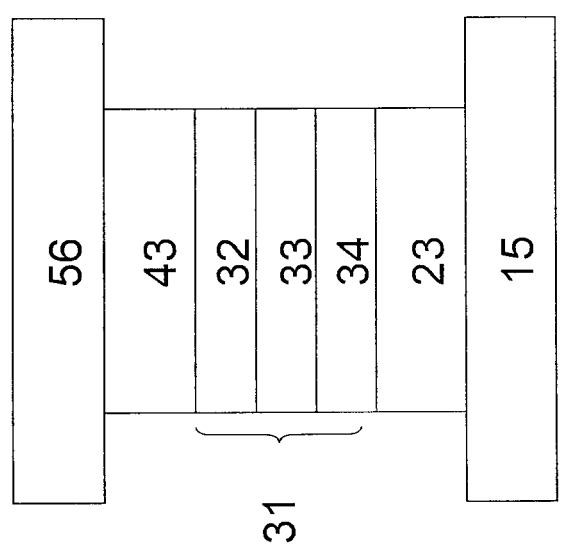
FIG. 2 is a schematic of a photovoltaic device having multiple layers.

Referring to FIG. 2, the semiconductor layer 31 may include multiple layers, including, for example, a cadmium telluride absorber layer 33 adjacent to a cadmium sulfide window layer 34. For improved performance, a semiconductor layer 31 may also include a zinc telluride reflector layer 32 adjacent to a cadmium telluride layer 31, and adjacent to a back contact 43.

As described above, insertion of a zinc telluride reflector layer 32 at the interface between a semiconductor absorber layer 33 and the back contact 43 is intended to provide a barrier against diffusion of minority electron carriers to the back contact 43, a technique called "electron reflection." When a photovoltaic device with a cadmium sulfide layer 34 and a cadmium telluride absorber layer 33 but no reflective layer 32 is under illumination, the electron-hole pairs generated by light in the depletion region of the cadmium telluride bulk are separated by an electron field creating electron flow toward the cadmium sulfide/cadmium telluride interface. However, not all electron-hole pairs are generated inside the space-charge region due to deep penetration of the light into the cadmium telluride (absorber) layer, and some electrons are capable of escaping the space-charge region by diffusion into the quasi-neutral region of the absorber layer 33. Minority electron carriers reaching the quasi-neutral regions can recombine with hole carriers in the cadmium telluride bulk or diffuse toward the back contact 43 and recombine with hole carriers there. Recombination causes power dissipation inside the device, thereby reducing power conversion efficiency.

To minimize recombination in the quasi-neutral region of the cadmium telluride layer, the cadmium telluride layer thickness can be reduced such that the electric field from the cadmium sulfide/cadmium telluride junction penetrates across the entire cadmium telluride layer. However, reducing the cadmium telluride layer thickness substantially increases the number of electrons reaching the back contact 43, resulting in higher recombination losses. Accordingly, semiconductor reflection layer 32 is provided, which is made of a semiconductor material with electron affinity lower than that of cadmium telluride, for example, zinc telluride. This reflection layer can be applied between the cadmium telluride and the back contact to minimize recombination at the back contact by acting as a barrier against electron flow toward the back contact 43.

Zinc telluride has the further advantage of being p-type dopable to carrier concentrations in excess of $1 \times 10^{18}$ cm$^{-3}$ using different methods and dopants, which promote more efficient movement of holes in a photovoltaic device. High carrier concentration, i.e. in excess of $1 \times 10^{18}$ cm$^{-3}$, is desirable to maintain high built-in potential in the resulting photovoltaic device as well as to enable good ohmic contact between the zinc telluride layer and the back contact 43.

When a zinc telluride layer is formed on a cadmium telluride surface, lattice mismatching at the cadmium telluride/zinc telluride hetero-interface can occur. Lattice mismatching causes stress at the interface between the two semiconductors through the formation of interface defects. Electrically speaking, interface defects may increase recombination losses causing additional power dissipation and reducing power conversion efficiency within the photovoltaic device, thereby negating the desired benefits of the reflector layer 32.

The present invention minimizes the negative effect of lattice mismatch between cadmium telluride and zinc telluride layers by introducing an intermediate semiconductor layer as a substitute for the zinc telluride layer, or as an additional layer between the cadmium telluride and zinc telluride layers, that provides either gradual or stepwise transition of the lattice constant, thus forming a graded intermediate layer. In either case, such an intermediate layer may consist of one or several Cd(1-x)Zn(x)Te layers where x defines any suitable number between 0 and 1 and the zinc mole-fraction increases either gradually or stepwise as it gets farther from the cadmium telluride layer. For example, x may define a number of more than about 0.0001, more than about 0.1, more than about 0.2, more than about 0.3, more than about 0.4, less than about 0.9999, less than about 0.8, less than about 0.7, less than about 0.6, or less than about 0.5. Also, x may define a number in a range of about 0.1 to about 0.3, about 0.2 to about 0.4, about 0.3 to about 0.5, about 0.4 to about 0.6, about 0.5, to about 0.7, about 0.6 to about 0.8, about 0.7 to about 0.9, or about 0.8 to about 1.

As a specific example, when introducing an intermediate layer as a substitute to the zinc telluride layer 32 (FIG. 2), a single potential Cd(1-x)Zn(x)Te layer where x is in the range of 0.2 to 0.3 may be placed adjacent to a cadmium telluride layer. This intermediate layer is sufficient to enable significant electron reflection, increasing open-circuit voltage, while mitigating interface defects due to a reduced lattice mismatch of only approximately 20% to 40% of the offset experienced between cadmium telluride and zinc telluride.

Changing the range of x as it defines the zinc mole-fraction of the Cd(1-x)Zn(x)Te layer may have advantages and disadvantages. For example, a potential Cd(1-x)Zn(x)Te layer where 0<x<0.2 may be placed adjacent to a cadmium telluride layer. This layer will have the advantage of more greatly reducing lattice mismatch, but the disadvantage of only slightly increasing electron reflection, reducing the benefit to open-circuit voltage. Conversely, a potential Cd(1-x)Zn(x)Te layer where 0.3<x<0.5 will have the benefit of increasing electron reflection, but, with this increased step in composition, the layer will have the disadvantage of increased lattice mismatch, causing power dissipation. An optimal value of x will balance these advantages and disadvantages relative to the specific needs of the intermediate layer. The optimal value for x may also depend on other factors affecting the interfacial quality, such as, the growth process employed, the growth temperature, and the growth rate.

As another example embodiment, a single potential Cd(1-x)Zn(x)Te layer created where x is in the range of 0.2 to 0.3 may be introduced as an intermediate layer between the cadmium telluride layer 33 and the zinc telluride layer 32 (FIG. 2). As described above, this intermediate layer will mitigate interface defects due to reduced lattice mismatch between the surface of the intermediate layer in contact with the cadmium telluride layer and the surface of the intermediate layer in contact with the zinc telluride layer 32, while increasing electron reflection capabilities closer to the zinc telluride layer 32. Other examples of the use of an intermediate layer Cd(1-x)Zn(x)Te, where the value of x changes within the intermediate layer are described in detail below.

Referring to FIG. 3, by way of an example of introducing an intermediate layer as a substitute for the zinc telluride layer, a photovoltaic device 20 may include a cadmium sulfide layer 220 deposited adjacent to a transparent conductive oxide layer. The transparent conductive oxide layer may be part of an annealed transparent conductive oxide stack 210. A cadmium telluride layer 230 may be deposited adjacent to cadmium sulfide layer 220. A cadmium zinc telluride layer 240 may be deposited adjacent to a cadmium telluride layer 230. Cadmium zinc telluride layer 240 may have any suitable thickness, including, for example, more than about 10 A, more than about 50 A, more than about 100 A, less than about 1 µm, less than about 0.5 µm, or less than about 0.2 µm. A back contact layer 250 may be deposited adjacent to cadmium zinc telluride layer 240, and a back support 200 may be applied adjacent to contact layer 250. Cadmium zinc telluride layer 240 can have a cadmium to zinc mole-to-mole ratio of about (1-x):x, where x defines a number from 0 to 1.

The cadmium zinc telluride layer 240 may also include a stack of multiple layers of cadmium zinc telluride. Referring to FIG. 4, by way of example, cadmium zinc telluride layer 240 may contain three layers, 313a-313c. Each of layers 313a-313c may be composed of a certain percent of cadmium or zinc. For example, layer 313a may be greater than 80% cadmium, layer 313c may be greater than 80% zinc and layer 313b may be less than approximately 80% cadmium and less than approximately 80% zinc. Each of layers 313a-313c may also be a layer of cadmium zinc telluride having a cadmium to zinc mole-to-mole ratio of (1−x):x, where x defines a number from 0 to 1. For example, x may define a number of more than about 0.0001, more than about 0.1, more than about 0.2, more than about 0.3, more than about 0.4, less than about 0.9999, less than about 0.8, less than about 0.7, less than about 0.6, or less than about 0.5. For example, x may define a number in a range of about 0.1 to about 0.3, about 0.2 to about 0.4, about 0.3 to about 0.5, about 0.4 to about 0.6, about 0.5, to about 0.7, about 0.6 to about 0.8, about 0.7 to about 0.9, or about 0.8 to about 1. Layer 313b can have a higher zinc mole-fraction than preceding layer 313a. Likewise, layer 313c may have a higher zinc mole-fraction than layer 313b. Each layer in the stack may have a thickness greater than about 10 A and less than about 1 μm.

Although FIG. 4 depicts three layers 313a, 313b, 313c within cadmium zinc telluride layer 240, the invention is not thus restricted. The invention may have any number of cadmium/zinc telluride layers. For example, the cadmium/zinc telluride layer can go from one layer (in the case where the concentration of cadmium to zinc is gradually changed within the layer) to an indefinite number of layers (in the case where layers of different concentration of cadmium to zinc are used).

The mole ratio of zinc to cadmium in a single cadmium zinc telluride layer 240 can also vary throughout the layer and increase as the distance from cadmium telluride layer 230 increases. For example, the concentration of cadmium in cadmium zinc telluride layer 240 and/or near the cadmium telluride/cadmium zinc telluride interface can be more than about 90%, but less than or equal to 99%. Conversely, the concentration of zinc can be less than about 10%, but more than or equal to 1%. Specifically, the cadmium concentration in cadmium zinc telluride layer 240 can gradually decrease while the relative zinc concentration increases, as the thickness of cadmium zinc telluride layer 240 (and thus the distance away from cadmium telluride layer 230) increases. Thus, the exposed surface of cadmium zinc telluride layer 240, immediately following deposition, can have a substantially high zinc concentration, e.g., more than about 70%, more than about 80%, or more than about 90%, even substantially close to 100%.

Cadmium zinc telluride layer 240 may be deposited using any suitable technique. For example, a gradual profile of zinc atoms may be introduced into the cadmium telluride layer using a diffusion process from a gaseous zinc source, or diffusion from a solid zinc source. Alternatively, the cadmium zinc telluride layer can be deposited by simultaneously depositing cadmium and zinc, and gradually varying the amount of each which is supplied. A plurality of cadmium zinc telluride layers may also be deposited, with each layer having a fixed composition.

Figure 5A:
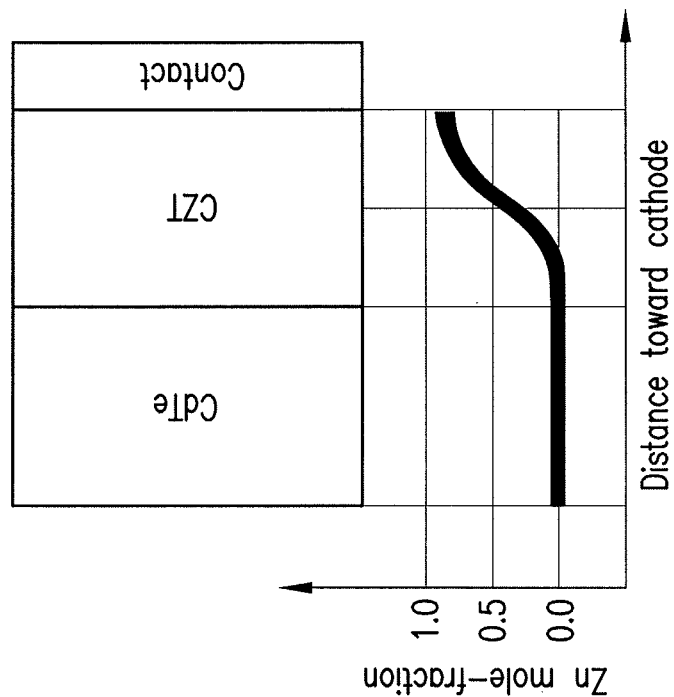
FIGS. 5a-5b illustrate mole-fraction profiles for various photovoltaic device configurations.
Figure 5B:
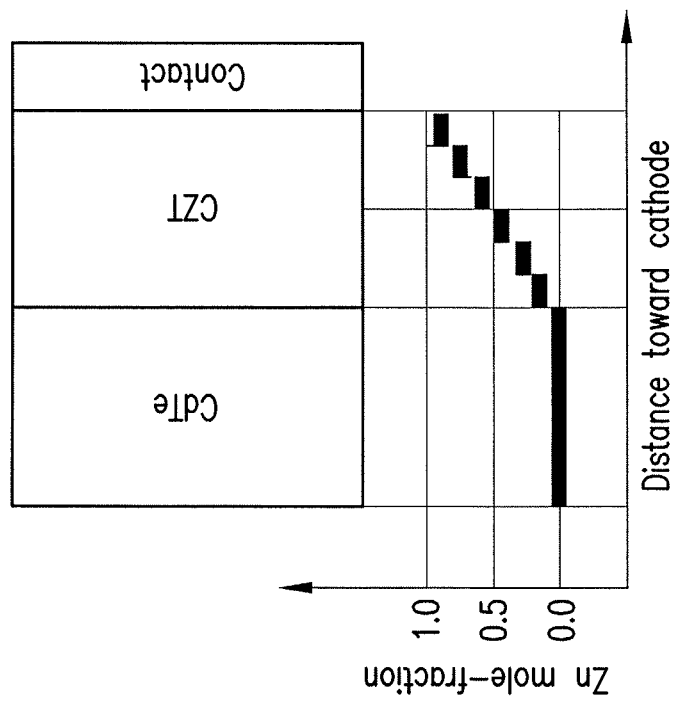

FIGS. 5a and 5b illustrate the zinc/cadmium mole-fraction profiles of two example layer configurations for introducing an intermediate layer or plurality of layers as a substitute for the zinc telluride layer. FIG. 5a depicts a stepwise increase of a zinc mole-fraction in the intermediate layer from 0 to 1, moving away from the cadmium telluride layer towards the back contact. FIG. 5b depicts a gradual increase (as opposed to the step-wise representation in FIG. 5a) of a zinc-mole fraction in the intermediate layer from 0 to 1, moving away from the cadmium telluride layer towards the back contact.

Referring to FIG. 6, by way of an example of introducing an intermediate layer between the cadmium telluride layer and a zinc telluride layer, a photovoltaic device 40 may include a cadmium sulfide layer 420 deposited adjacent to a transparent conductive oxide layer. The transparent conductive oxide layer may be part of an annealed transparent conductive oxide stack 410. A cadmium telluride layer 430 may be deposited adjacent to cadmium sulfide layer 420. A cadmium zinc telluride layer 440 may be deposited adjacent to a cadmium telluride layer 430. A zinc telluride layer 445 may be deposited adjacent to the cadmium zinc telluride layer 440. Cadmium zinc telluride layer 440 may have any suitable thickness, including, for example, more than about 10 A, more than about 50 A, more than about 100 A, less than about 1 μm, less than about 0.5 μm, or less than about 0.2 μm. A back contact layer 450 may be deposited adjacent to zinc telluride layer 445, and a back support 400 may be deposited adjacent thereto.

It should be noted and appreciated that any of the aforementioned descriptions of cadmium zinc telluride layer 240 with reference to FIG. 3 or FIG. 4 or any other embodiment of the intermediate layer described herein, may describe or apply to cadmium zinc telluride layer 440 with reference to FIG. 6.

Figure 7B:
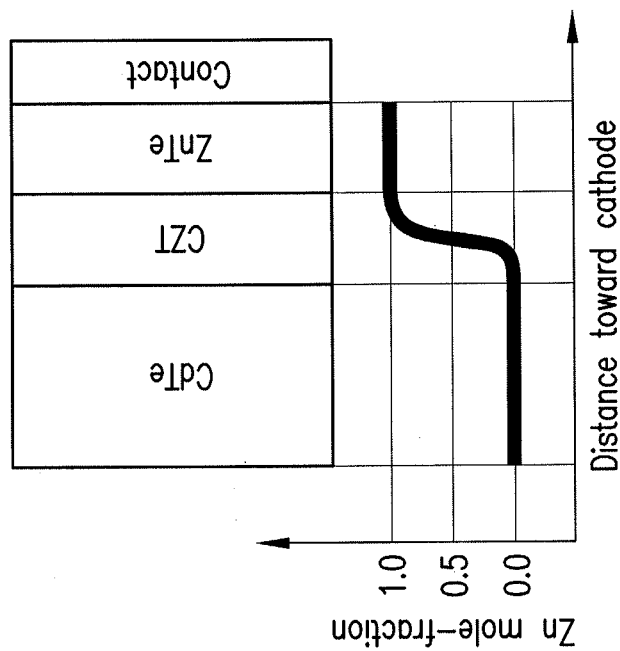
FIGS. 7a-7b illustrate mole-fraction profiles for various photovoltaic device configurations.
Figure 7A:
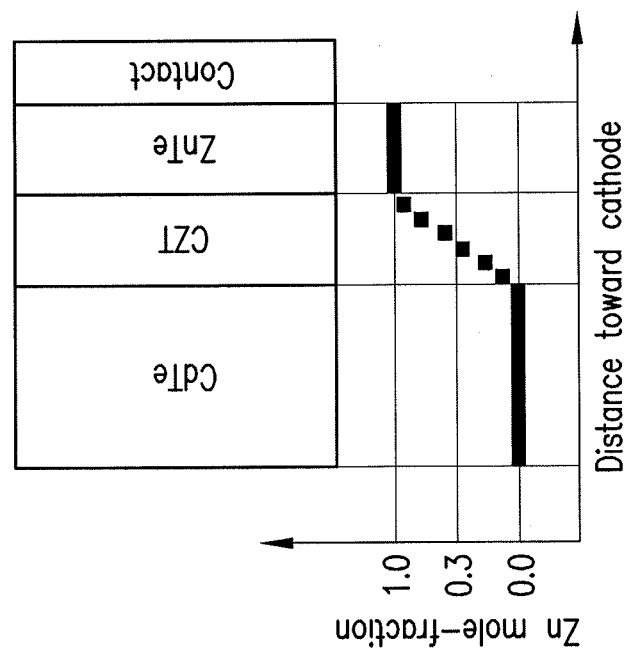

FIGS. 7a and 7b illustrate the zinc/cadmium mole-fraction profiles of two example layer configurations for introducing an intermediate layer between a cadmium telluride layer and a zinc telluride layer. FIG. 7a depicts a stepwise increase of a zinc mole-fraction in the intermediate layer from 0 to 1, moving away from the cadmium telluride layer towards the zinc telluride layer. FIG. 7b depicts a gradual increase (as opposed to the step-wise representation in FIG. 7a) of a zinc-mole fraction in the intermediate layer from 0 to 1, moving away from the cadmium telluride layer towards the zinc telluride layer.

Figure 8:
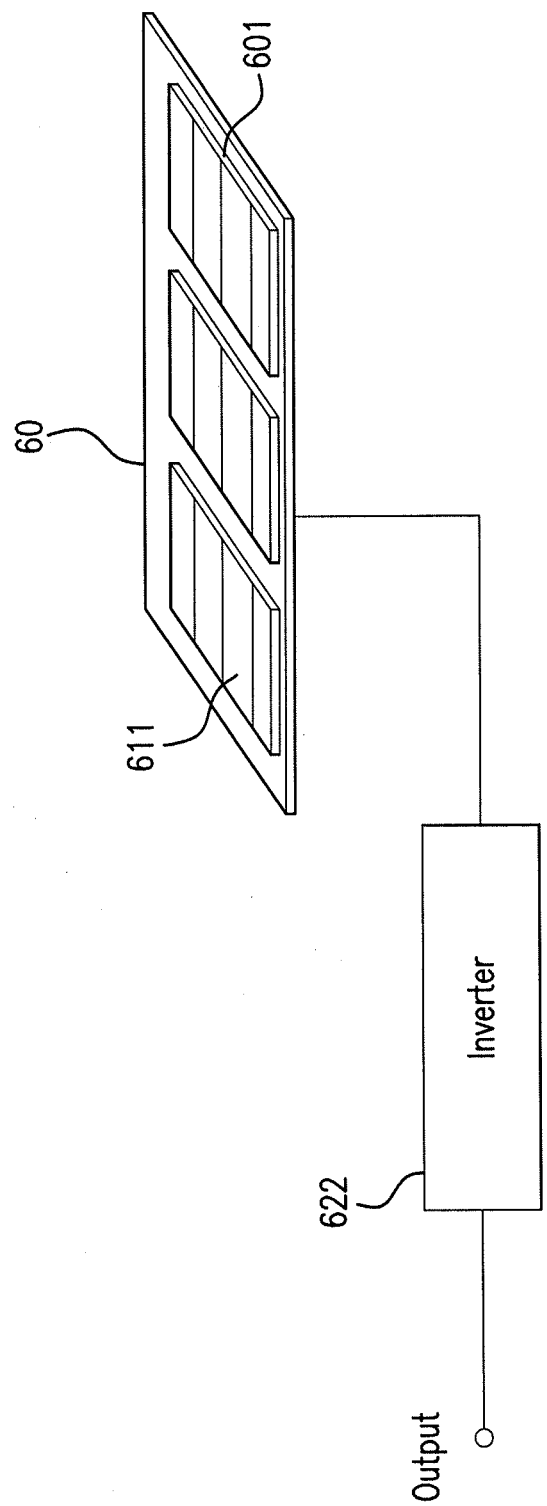
FIG. 8 is a schematic of a system for generating electricity.

Photovoltaic devices/cells fabricated using the methods discussed herein may be incorporated into one or more photovoltaic modules, which may in turn be connected into an array. Referring to FIG. 8, by way of example, a photovoltaic array 60 may include one or more interconnected photovoltaic modules 601. One or more of photovoltaic modules 601 may include one or more photovoltaic cells 611 having any of the multilayered structure or photovoltaic device configurations discussed herein.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A photovoltaic device comprising:
   a semiconductor window layer;
   a semiconductor absorber layer comprising CdTe adjacent the window layer, the semiconductor window layer and semiconductor absorber layer forming a p-n junction providing an electric field;
   an interface layer adjacent to the semiconductor absorber layer comprising a mixture containing Cd, Zn and Te, wherein the interface layer has a first side directly on and facing the absorber layer and a second side; and
   a contact layer directly on the second side of the interface layer.

2. The photovoltaic device of claim 1, wherein the concentration of Zn in the interface layer increases in accordance with a distance away from the first side of the interface layer.

3. The photovoltaic device of claim 1, wherein the mole ratio of the interface layer is $Cd_{1-x}Zn_x Te$, where x defines a number between 0 and 1.

4. The photovoltaic device of claim 3, wherein x defines a number greater than about 0.2.

5. The photovoltaic device of claim 3, wherein x defines a number greater than about 0.5.

6. The photovoltaic device of claim 3, wherein x defines a number less than about 0.8.

7. The photovoltaic device of claim 3, wherein x defines a number less than about 0.5.

8. The photovoltaic device of claim 3, wherein x defines a number from about 0.2 to 0.3.

9. The photovoltaic device of claim 3, wherein x defines a number from about 0.6 to 0.8.

10. The photovoltaic device of claim 1, wherein x defines a number between about 0.8 and 1.

11. The photovoltaic device of claim 3, wherein x is equal to about 0 at the first side of the interface layer and about 1 at the second side of the interface layer.

12. The photovoltaic device of claim 1, wherein the interface layer comprises a stack of discrete interface layers, each layer comprising a mixture containing Cd, Zn and Te and each layer having uniform mixture of Cd and Zn, and each layer having a different concentration of Cd and Zn.

13. The photovoltaic device of claim 12, wherein the mole-to-mole ratio of Cd to Zn in each discrete interface layer decreases incrementally the further away the discrete interface layer is from the semiconductor absorber layer.

14. The photovoltaic device of claim 13, wherein the mole-to-mole ratio of Cd to Zn in each discrete interface layer is about (1−x):x, where x defines a different number between 0 and 1 for each discrete interface layer.

15. The photovoltaic device of claim 11, wherein the concentration of Cd and Zn changes continually from said first side of the interface layer to said second side.

16. The photovoltaic device of claim 1, wherein the concentration of Zn in the interface layer is lower on the first side of the interface layer facing the semiconductor absorber layer and higher on the second side of the interface layer facing the contact layer.

17. The photovoltaic device of claim 1, wherein the mole-to-mole ratio between Cd and Zn throughout the interface layer is about (1−x):x, where x defines a number from 0 to 1.

18. The photovoltaic device of claim 1, wherein the mole-to-mole ratio between Cd and Zn throughout the interface layer is about (1−x):x, where x defines a number greater than about 0.2.

19. The photovoltaic device of claim 1, wherein the mole-to-mole ratio between Cd and Zn throughout the interface layer is about (1−x):x, where x defines a number greater than about 0.5.

20. The photovoltaic device of claim 1, wherein the mole-to-mole ratio between Cd and Zn throughout the interface layer is about (1−x):x, where x defines a number less than about 0.8.

21. The photovoltaic device of claim 1, wherein the mole-to-mole ratio between Cd and Zn throughout the interface layer is about (1−x):x, where x defines a number less than about 0.5.

22. The photovoltaic device of claim 1, wherein the mole-to-mole ratio between Cd and Zn throughout the interface layer is about (1−x):x, where x defines a number from about 0.2 to about 0.3.

23. The photovoltaic device of claim 1, wherein the mole-to-mole ratio between Cd and Zn throughout the interface layer is about (1−x):x, where x defines a number from about 0.6 to 0.8.

24. The photovoltaic device of claim 1, wherein the mole-to-mole ratio between Cd and Zn throughout the interface layer is about (1−x):x, where x defines a number from about 0.8 to 1.

25. The photovoltaic device of claim 17, wherein x is equal to about 0 at the first side of the interface layer and about 1 at the second side of the interface layer.

26. The photovoltaic device of claim 16, wherein the interface layer comprises a stack of discrete interface layers, each layer comprising a mixture containing Cd, Zn and Te and each layer having a uniform mixture of Cd and Zn, each layer having a different concentration of Cd and Zn.

27. The photovoltaic device of claim 26, wherein the mole-to-mole ratio of Cd to Zn in each discrete interface layer decreases incrementally moving from the semiconductor absorber layer toward the third semiconductor material.

28. The photovoltaic device of claim 27, wherein the mole-to-mole ratio of Cd and Zn in each discrete interface layer is about (1−x):x, where x defines a different number from 0 to 1 for each discrete interface layer.

29. A photovoltaic device comprising:
a substrate;
a semiconductor window layer;
a semiconductor absorbing layer comprising CdTe over the window layer, the absorber layer and window layer forming a p-n junction producing an electric field;
an intermediate semiconductor interface layer comprising a mixture of Cd and Zn over the semiconductor absorbing layer, wherein the intermediate semiconductor interface has a first side directly on and facing the semiconductor absorbing layer and a second side; and
a contact layer directly on the second side of the intermediate semiconductor interface layer, wherein the concentration of Cd relative to Zn is higher on the first side of the intermediate semiconductor interface layer facing the semiconductor absorbing layer and lower on the second side of the intermediate semiconductor interface layer.

30. The photovoltaic device of claim 26, wherein the Cd and Zn composition of the intermediate semiconductor interface layer goes from being approximately 70% Cd and 30% Zn at the first side of the intermediate semiconductor interface layer to approximately 30% Cd and 70% Zn at the second side of the intermediate semiconductor interface layer.

31. The photovoltaic device of claim 29, wherein the Cd and Zn composition of the intermediate semiconductor interface layer goes from being approximately 80% Cd and 20% Zn at the first side of the intermediate semiconductor layer to approximately 20% Cd and 80% Zn at the second side of the intermediate semiconductor interface layer.

32. The photovoltaic device of claim 29, wherein the Cd and Zn composition of the intermediate semiconductor layer goes from being approximately 90% Cd and 10% Zn at the first side of the intermediate semiconductor interface layer to approximately 10% Cd and 90% Zn at the second side of the intermediate semiconductor interface layer.

33. The photovoltaic device of claim 29, wherein the Cd and Zn composition of the intermediate semiconductor interface layer goes from being approximately 100% Cd and 0% Zn at the first side of the intermediate semiconductor interface layer Zn to approximately 0% Cd and 100% Zn at the second side of the intermediate semiconductor interface layer.

34. The photovoltaic device of claim 29, wherein the intermediate semiconductor interface layer includes a plurality of layers of different compositions of Cd and Zn.

35. The photovoltaic device of claim 34, wherein the plurality of layers of different compositions of Cd and Zn each comprise cadmium zinc telluride.

36. The photovoltaic device of claim 35 wherein the plurality of different layers of different compositions of Cd and Zn comprises:
a first layer having a Cd and Zn composition of greater than approximately 80% percent Cd and being closest to the semiconductor absorbing layer;
a second layer having a Cd and Zn composition of greater than approximately 80% Zn and being farthest from the semiconductor absorbing layer; and
at least a third layer between the first and second layers having a Cd and Zn composition of less than approximately 80% Cd and less than approximately 80% Zn.

37. The photovoltaic device of claim 29 further comprising a semiconductor reflecting layer comprising Zn between the intermediate semiconductor interface layer and the contact layer.

38. The photovoltaic device of claim 37, wherein the Cd and Zn composition of the intermediate semiconductor interface layer goes from being approximately 70% Cd and 30% Zn at the first side of the intermediate semiconductor interface layer to approximately 30% Cd and 70% Zn at the second side of the intermediate semiconductor interface layer.

39. The photovoltaic device of claim 37, wherein the Cd and Zn composition of the intermediate semiconductor interface layer goes from being approximately 80% Cd and 20% Zn at the first side of intermediate semiconductor interface layer to approximately 20% Cd and 80% Zn at the second side of the intermediate semiconductor interface layer.

40. The photovoltaic device of claim 37, wherein the Cd and Zn composition of the intermediate semiconductor interface layer goes from being approximately 90% Cd and 10% Zn at the first side of the intermediate semiconductor interface layer to approximately 10% Cd and 90% Zn at the second side of the intermediate semiconductor interface layer.

41. The photovoltaic device of claim 37, wherein the Cd and Zn composition of the intermediate semiconductor interface layer goes from being approximately 100% Cd and 0% Zn at the first side of the intermediate semiconductor interface layer to approximately 0% Cd and 100% Zn at the second side of the intermediate semiconductor interface layer.

42. The photovoltaic device of claim 37, wherein the intermediate semiconductor interface layer includes a plurality of layers of different compositions.

43. The photovoltaic device of claim 42, wherein the plurality of layers of different Cd and Zn compositions each comprise cadmium zinc telluride.

44. The photovoltaic device of claim 43, wherein the plurality of layers of different Cd and Zn compositions comprises:
a first layer having a Cd and Zn composition of greater than approximately 80% percent Cd and being closest to the semiconductor absorbing layer;
a second layer having a Cd and Zn composition of greater than approximately 80% Zn and being closest to the semiconductor reflecting layer; and
at least a third layer between the first and second layers having a Cd and Zn composition of less than approximately 80% Cd and less than approximately 80% Zn.

45. A photovoltaic device comprising:
an absorber layer comprising CdTe, wherein the absorber layer and another layer form a p-n junction which produces an electric field;
a cadmium zinc telluride layer over the absorber layer, wherein the cadmium zinc telluride layer has a first side in contact with and facing the absorber layer and an opposite second side; and
a contact layer over and in contact with the opposite second side of the cadmium zinc telluride layer.

46. The photovoltaic device of claim 45, wherein the concentration of cadmium relative to zinc in the cadmium zinc telluride layer is higher on the first side of the cadmium zinc telluride layer facing the absorber layer and lower on the opposite second side of the cadmium zinc telluride layer.

47. The photovoltaic device of claim 46, wherein the decrease from the higher concentration of cadmium in the cadmium zinc telluride layer to the lower concentration of cadmium in the cadmium zinc telluride layer is gradual.

48. The photovoltaic device of claim 46, wherein the decrease from the higher concentration of cadmium in the cadmium zinc telluride layer to the lower concentration of cadmium in the cadmium zinc telluride layer is stepped.

* * * * *